(12) United States Patent
Umetani

(10) Patent No.: US 11,781,052 B2
(45) Date of Patent: Oct. 10, 2023

(54) THERMALLY CONDUCTIVE COMPOSITION AND THERMALLY CONDUCTIVE MOLDED BODY

(71) Applicant: SEKISUI POLYMATECH CO., LTD., Saitama (JP)

(72) Inventor: Hiroshi Umetani, Saitama (JP)

(73) Assignee: SEKISUI POLYMATECH CO., LTD., Saitama (JP)

( * ) Notice: Subject to any disclaimer, the term of this patent is extended or adjusted under 35 U.S.C. 154(b) by 127 days.

(21) Appl. No.: 16/956,343

(22) PCT Filed: Jan. 16, 2019

(86) PCT No.: PCT/JP2019/000994
§ 371 (c)(1),
(2) Date: Jun. 19, 2020

(87) PCT Pub. No.: WO2019/150944
PCT Pub. Date: Aug. 8, 2019

(65) Prior Publication Data
US 2020/0317979 A1 Oct. 8, 2020

(30) Foreign Application Priority Data
Jan. 31, 2018 (JP) .................... 2018-014487

(51) Int. Cl.
| | | |
|---|---|---|
| C09K 5/14 | (2006.01) | |
| C08G 77/04 | (2006.01) | |
| C08J 5/18 | (2006.01) | |
| C08K 3/22 | (2006.01) | |
| C08K 3/28 | (2006.01) | |
| C09D 183/04 | (2006.01) | |
| C08L 83/04 | (2006.01) | |
| C08G 77/00 | (2006.01) | |
| H01L 23/36 | (2006.01) | |

(52) U.S. Cl.
CPC ............ *C09K 5/14* (2013.01); *C08G 77/04* (2013.01); *C08J 5/18* (2013.01); *C08K 3/22* (2013.01); *C08K 3/28* (2013.01); *C08L 83/04* (2013.01); *C09D 183/04* (2013.01); *C08G 77/80* (2013.01); *C08J 2383/04* (2013.01); *C08K 2003/2227* (2013.01); *C08K 2003/282* (2013.01); *C08K 2201/001* (2013.01); *C08K 2201/005* (2013.01); *H01L 23/36* (2013.01)

(58) Field of Classification Search
CPC .. C08G 77/04; C08G 77/80; C08J 5/18; C08J 2383/04; C08K 3/22; C08K 3/28; C08K 2003/2227; C08K 2003/282; C08K 2201/001; C08K 2201/005; C08L 83/04; C09D 183/04; C09K 5/14; H01L 23/36
See application file for complete search history.

(56) References Cited

U.S. PATENT DOCUMENTS

| | | | |
|---|---|---|---|
| 8,912,132 B2* | 12/2014 | Kato | ............... C09K 5/14 |
| | | | 508/172 |
| 2004/0106717 A1 | 6/2004 | Asaine | |
| 2008/0085966 A1* | 4/2008 | Fukui | ............... C08L 83/06 |
| | | | 524/588 |
| 2013/0137613 A1 | 5/2013 | Kato et al. | |
| 2017/0210964 A1* | 7/2017 | Ito | ............... C08L 83/04 |
| 2020/0270499 A1* | 8/2020 | Ota | ............... H01M 10/655 |

FOREIGN PATENT DOCUMENTS

| | | |
|---|---|---|
| CN | 101035876 A | 9/2007 |
| CN | 102947430 A | 2/2013 |
| CN | 103194067 A | 7/2013 |
| CN | 104015433 A | 9/2014 |
| CN | 105111743 A | 12/2015 |
| JP | 2005-194479 A | 7/2005 |
| JP | 2007-150349 A | 6/2007 |
| JP | 2007-277406 A | 10/2007 |
| JP | 2012-007057 A | 1/2012 |

(Continued)

OTHER PUBLICATIONS

Shin-Etsu Silicone Fluid Brochure, Mar. 2017, retrieved from the internet at < http://web.archive.org/web/20170722055750/http://www.shinetsusilicone-global.com/catalog/pdf/fluid_e.pdf> on Jun. 9, 2022 (Year: 2017).*

Extended European Search Report for European Patent App. No. 19747034.7 (dated Sep. 28, 2021).

International Search Report for PCT Patent App. No. PCT/JP2019/000994 (dated Mar. 19, 2019).

Office Action from Chinese Patent App. No. 201980005573.4 (dated Oct. 28, 2021).

Office Action from Chinese Patent App. No. 201980005573.4 (dated Apr. 24, 2022).

(Continued)

*Primary Examiner* — James C Goloboy
(74) *Attorney, Agent, or Firm* — Cermak Nakajima & McGowan LLP; Tomoko Nakajima

(57) ABSTRACT

The present invention provides a thermally conductive composition in which the flexibility of the thermally conductive composition is not impaired, and even when cured into a thermally conductive molded body, good bendability, an excellent handling property, and excellent thermal conductivity are exhibited, and provides a molded body of the thermally conductive composition. A thermally conductive composition, in which a thermally conductive filler is contained in a polymer matrix, includes a methyl phenyl silicone, characterized in that the thermally conductive filler has an average particle size of 10 to 100 μm, the content of the thermally conductive filler in the thermally conductive composition is 70% to 90% by volume, and 30% to 80% by volume of the thermally conductive filler has a particle size of 40 μm or more. A thermally conductive molded body is formed of a cured body of the thermally conductive composition.

12 Claims, No Drawings

(56) References Cited

FOREIGN PATENT DOCUMENTS

| JP | 2014-193598 | A |   | 10/2014 |
|----|-------------|---|---|---------|
| JP | 2014193598  | A | * | 10/2014 |
| JP | 2015071662  | A | * | 4/2015  |
| JP | 2016-113540 | A |   | 6/2016  |
| JP | 2017-226724 | A |   | 12/2017 |
| WO | WO2018/088416 | A1 |  | 5/2018  |

OTHER PUBLICATIONS

Cataloguing in Publication (CIP) data, Practical Dictionary of Chemical Engineering/edited by Zhu Hongfa, Archival Library of Chinese Publication CIP (2004) No. 106695, Jindun Publication House, Beijing, China, Dec. 2004, with English language translation of relevant sections.

* cited by examiner

THERMALLY CONDUCTIVE COMPOSITION AND THERMALLY CONDUCTIVE MOLDED BODY

This application is a national phase entry under 35 U.S.C. § 371 of PCT Patent Application No. PCT/JP2019/000994, filed on Jan. 16, 2019, which claims priority under 35 U.S.C. § 119 to Japanese Patent Application No. 2018-014487, filed Jan. 31, 2018, both of which are incorporated by reference.

TECHNICAL FIELD

The present invention relates to a thermally conductive composition and a thermally conductive molded body formed of a cured body thereof. More particularly, the invention relates to a thermally conductive composition effective as a heat transfer material which is interposed, in order to cool a heat-generating electronic component, between the electronic component and a cooling member (e.g., a heat sink) or a heat-generating member such as a circuit board, and a thermally conductive molded body formed of a cured body of the thermally conductive composition.

BACKGROUND ART

In order to cool a heat-generating electronic component, a heat dissipation sheet which is interposed between the electronic component and a heat dissipating member to assist heat transfer is used. The heat dissipation sheet, in which a thermally conductive filler is dispersed in a polymer matrix serving as a binder, is generally obtained by forming a thermally conductive molded body, which is a cured body of a thermally conductive composition, into a sheet shape. For example, Japanese Unexamined Patent Application Publication No. 2007-150349 (Patent Literature 1) describes a technique in which a silicone resin is used as a binder, and Japanese Unexamined Patent Application Publication No. 2016-113540 (Patent Literature 2) describes a technique in which an epoxy resin is used.

CITATION LIST

Patent Literature

PTL 1: Japanese Unexamined Patent Application Publication No. 2007-150349
PTL 2: Japanese Unexamined Patent Application Publication No. 2016-113540

SUMMARY OF INVENTION

Technical Problem

However, in recent years, an increase in thermal conductivity of a heat dissipation sheet has been promoted. In order to achieve an increase in thermal conductivity of a heat dissipation sheet, it is conceivable to increase the number of contact points of particles constituting a thermally conductive filler inside the heat dissipation sheet so that as many heat paths (heat transfer paths) as possible can be formed. For that purpose, an increase in the filling ratio of the thermally conductive filler inside the heat dissipation sheet is required.

However, when the content of the thermally conductive filler inside the heat dissipation sheet is increased, the ratio of a polymer matrix serving as a binder for binding particles in the thermally conductive filler together is relatively decreased. As a result, the heat dissipation sheet becomes fragile, and a problem related to the softness of the heat dissipation sheet, such as a loss of bendability, arises. Furthermore, the handling property of the heat dissipation sheet is deteriorated. For example, a heat dissipation sheet containing a thermally conductive filler at a high filling ratio is often integrated with a release-treated sheet of paper or film, which is referred to as a "separator". When the heat dissipation sheet is peeled off from the separator, if the heat dissipation sheet lacks bendability, peeling is difficult, and a problem arises, such as cracking of the heat dissipation sheet.

In order to maintain the flexibility and bendability of the heat dissipation sheet while incorporating a thermally conductive filler at a high filling ratio, it is also conceivable to decrease the molecular weight of a polymer matrix serving as a binder. In order to decrease the molecular weight of the polymer matrix, a method may be used in which a polymer matrix composed of a polymer with a lower molecular weight is used or in which the polymer is partially replaced with an oil, oligomer, monomer, or the like.

However, because of its high volatility, a low-molecular-weight compound, such as an oil, monomer, or oligomer, volatilizes from a heat dissipation sheet with time, and there is a concern that the flexibility and bendability of the heat dissipation sheet may be lost. Moreover, when the flexibility and bendability of the heat dissipation sheet are lost, the handling property of the heat dissipation sheet is deteriorated. Furthermore, it becomes hard for the heat dissipation sheet to adhere to a heat-generating member, such as a substrate, and there is a concern that thermal conductivity may be decreased. Accordingly, on the basis of these concerns, it has been required of course to select an oil, monomer, or oligomer that is hard to volatilize from a heat dissipation sheet, and in particular, it has been strongly required to provide a thermally conductive composition in which the flexibility or bendability of a heat dissipation sheet is not lost even when a thermally conductive filler is incorporated at a high filling ratio.

In order to solve these problems, the present invention provides a thermally conductive composition in which the flexibility of the thermally conductive composition is not impaired, and even when cured into a thermally conductive molded body, good flexibility and bendability, an excellent handling property, and excellent thermal conductivity are exhibited, and provides a molded body of the thermally conductive composition.

Solution to Problem

In order to achieve the object described above, a thermally conductive composition according to the present invention is configured as follows. That is, the present invention provides a thermally conductive composition in which a thermally conductive filler is contained in a polymer matrix, the composition including a methyl phenyl silicone, characterized in that the thermally conductive filler has an average particle size of 10 to 100 µm, the content of the thermally conductive filler in the thermally conductive composition is 70% to 90% by volume, and 30% to 80% by volume of the thermally conductive filler has a particle size of 40 µm or more.

According to the present invention, a thermally conductive composition in which a thermally conductive filler is contained in a polymer matrix includes a methyl phenyl silicone, in which the thermally conductive filler has an average particle size of 10 to 100 µm, the content of the thermally conductive filler in the thermally conductive composition is 70% to 90% by volume, and 30% to 80% by volume of the thermally conductive filler has a particle size of 40 µm or more. Therefore, a thermally conductive composition in which flexibility is not impaired can be obtained.

Furthermore, regarding existing thermally conductive compositions, in the case where, without changing constituents, a thermally conductive filler is incorporated at a high filling ratio or the proportion of particles of a thermally conductive filler having a large particle size of 40 µm or more is increased, there is a concern that the flexibility of the thermally conductive composition may be significantly reduced. In contrast, in the thermally conductive composition according to the present invention, since the methyl phenyl silicone is incorporated, even when the filling ratio of particles of the thermally conductive filler having a large particle size of 40 µm or more is increased, reduction in the flexibility of the thermally conductive composition can be suppressed. Furthermore, a thermally conductive molded body obtained by curing the thermally conductive composition has good flexibility and bendability and an excellent handling property.

The thermally conductive composition according to the present invention may be configured such that the content of the methyl phenyl silicone in the thermally conductive composition is 1% to 10% by volume. Since the thermally conductive composition is configured such that the content of the methyl phenyl silicone in the thermally conductive composition is 1% to 10% by volume, even when the thermally conductive filler is incorporated at a high filling ratio, and furthermore, even when the proportion of particles of the thermally conductive filler having a large particle size of 40 µm or more is increased, a thermally conductive composition in which flexibility is not impaired can be obtained.

The thermally conductive composition according to the present invention may be configured such that the methyl phenyl silicone has a refractive index, in accordance with JIS K 0062:1992, of 1.427 or more. Since the refractive index, in accordance with JIS K 0062:1992, of the methyl phenyl silicone is set to be 1.427 or more, the flexibility of the thermally conductive composition is not impaired.

In the thermally conductive composition according to the present invention, the thermally conductive filler may be configured such that 20% to 50% by volume of the thermally conductive filler has a particle size of less than 5 µm. Since the thermally conductive filler in which 20% to 50% by volume of the thermally conductive filler has a particle size of less than 5 µm is used, even when incorporated together with particles of the thermally conductive filler with a large particle size of 40 µm or more in the thermally conductive composition, the flexibility of the thermally conductive composition is not impaired. That is, according to the configuration described above, by incorporating particles of the thermally conductive filler with a large particle size and particles of the thermally conductive filler with a small particle size, the particles of the thermally conductive filler with a small particle size are interposed between the particles of the thermally conductive filler with a large particle size, and the number of contact points between the particles of the thermally conductive filler can be increased. Therefore, efficient heat transfer paths can be formed.

In the thermally conductive composition according to the present invention, the thermally conductive filler may be configured such that the total content of particles of the thermally conductive filler with a particle size of 40 µm or more and particles of the thermally conductive filler with a particle size of less than 5 µm is 90% by volume or more in the whole thermally conductive filler. In the thermally conductive composition, since the total content of the particles of the thermally conductive filler with a particle size of 40 µm or more and the particles of the thermally conductive filler with a particle size of less than 5 µm is set to be 90% by volume or more in the whole thermally conductive filler, by curing the thermally conductive composition, a thermally conductive molded body having a high thermal conductivity of 4.5 W/m·K or more can be obtained.

The thermally conductive composition according to the present invention may be configured such that the thermally conductive filler is selected from a metal, a metal oxide, a metal nitride, and a metal carbide. Since the thermally conductive filler is selected from a metal, a metal oxide, a metal nitride, and a metal carbide, the thermally conductive composition according to the present invention can have desired thermal conductivity.

The thermally conductive composition according to the present invention may be configured such that the polymer matrix is an addition-reaction-curable silicone. Since the polymer matrix is an addition-reaction-curable silicone, a two-part curable silicone composed of a main agent and a curing agent can be used. By storing a main agent and a curing agent separately, long-term storage stability can be maintained until the two agents are mixed.

The present invention also provides a thermally conductive molded body formed of a cured body of any one of the thermally conductive compositions described above. Since the thermally conductive molded body is formed of any one of the thermally conductive compositions described above, the thermally conductive molded body has good bendability, an excellent handling property, and excellent thermal conductivity. The thermally conductive molded body may be sheet-shaped. Since the thermally conductive molded body is sheet-shaped, the thermally conductive molded body can be easily interposed between a heat-generating member and a cooling member, thus exhibiting an excellent handling property.

The thermally conductive molded body according to the present invention may be configured as a thermally conductive molded body having a thermal conductivity of 4.5 W/m·K or more. Since the thermally conductive molded body has a thermal conductivity of 4.5 W/m·K or more, by interposing the thermally conductive molded body between a heat-generating member and a cooling member, effective thermal conductivity can be obtained. Furthermore, the thermally conductive molded body according to the present invention may be configured as a thermally conductive molded body having an E hardness of 20 to 70. Since the thermally conductive molded body has an E hardness of 20 to 70, even when the thermally conductive molded body is interposed between a heat-generating member and a cooling member, the thermally conductive molded body is soft and can be made to adhere closely to both the heat-generating member and the cooling member. As a result, effective heat conduction can be achieved. Furthermore, when the thermally conductive molded body (heat dissipation sheet) is peeled off from a separator, since the thermally conductive molded body has moderate flexibility, bendability can be imparted to the thermally conductive molded body. Therefore, the thermally conductive molded body can be peeled off from the separator so as not to cause cracking of the thermally conductive molded body. In general, from the viewpoint of the handling property, the E hardness of the thermally conductive molded body is preferably set in the range described above. On the other hand, if the thermally conductive molded body has an E hardness of less than 20 and is excessively soft, for example, when the thermally conductive molded body is peeled off from the separator, there is a concern that the thermally conductive molded body may stretch and a shape to be used may not be obtained. On the other hand, if the thermally conductive molded body has an E hardness of more than 70 and is excessively hard, adhesion of the heat-generating member or the cooling member to the thermally conductive molded body is deteriorated, and there is a concern that the effect of thermal conductivity may be decreased.

Advantageous Effects of Invention

In the thermally conductive composition and the thermally conductive molded body according to the present invention, flexibility and bendability are not impaired, and an excellent handling property and excellent thermal conductivity can be exhibited.

DESCRIPTION OF EMBODIMENTS

A thermally conductive composition and a thermally conductive molded body, which is a cured body thereof, according to the present invention will be described in detail on the basis of embodiments. Regarding materials, production methods, effects and advantages, functions, and the like that are the same in the embodiments, repeated explanations thereof will be omitted.

<Thermally Conductive Composition>

The thermally conductive composition according to the present invention is a thermally conductive composition in which a thermally conductive filler is contained in a polymer matrix, the composition including a methyl phenyl silicone, in which the thermally conductive filler includes particles having a relatively large particle size. Components constituting the thermally conductive composition will be described below.

The polymer matrix is formed of a polymeric material, such as a resin or rubber. The polymer matrix is preferably formed of a polymer composition which is composed of a liquid mixed system including, for example, a main agent and a curing agent, and is reacted and cured after mixing, or a reaction-cured body obtained by curing the polymer composition. The polymer composition can be, for example, a composition including uncrosslinked rubber and a crosslinker, or a composition including crosslinker-containing uncrosslinked rubber and a crosslinking promoter. Furthermore, the curing reaction may be room temperature curing or heat curing, or depending on the case, may be photocuring. When the polymer matrix is a silicone rubber, for example, a mixed system of an alkenyl group-containing organopolysiloxane and an organohydrogenpolysiloxane may be used.

Among these, the polymer matrix is preferably an addition-reaction-curable silicone. When the polymer matrix is formed of an addition-reactive silicone, an addition-reactive silicone composed of a main agent and a curing agent can be used, and the main agent and the curing agent can be stored separately in their respective syringes or the like. Therefore, a curing reaction does not take place until the main agent and the curing agent are mixed, and thus excellent long-term storage stability can be maintained.

Thermally conductive filler: The thermally conductive filler is a substance that is mixed in the polymer matrix to impart thermal conductivity. As the thermally conductive filler, for example, spherical or amorphous powder of a metal oxide, a metal nitride, a metal carbide, carbon, or a metal may be used. Examples of the metal oxide include aluminum oxide (alumina), magnesium oxide, zinc oxide, iron oxide, and quartz. Examples of the metal nitride include boron nitride and aluminum nitride. These metal oxides and metal nitrides have an insulating property, and therefore can be suitably used, for example, in base stations desiring to avoid electrical influences, and for telecommunication equipment, such as optical communication routers. Examples of the metal carbide include silicon carbide. Examples of carbon include graphitized carbon powder and graphite powder. Examples of the metal include copper and aluminum.

Among these thermally conductive fillers, from the viewpoint of high thermal conductivity, it is preferable to use aluminum nitride. Furthermore, from the viewpoint of high thermal conductivity, easy availability of spherical powder, and stability at high temperatures with no concern that deterioration may occur even in the environment of 200° C., it is preferable to use aluminum oxide. Any of these thermally conductive fillers may be used as a mixture of two or more thereof.

At least part of these thermally conductive fillers may be subjected to surface treatment. For example, in the case where the thermally conductive filler hinders the curing reaction of the polymer matrix, it is effective to use a surface-treated thermally conductive filler.

As the surface treatment of the thermally conductive filler, a commonly used silane coupling agent having, as a functional group, a vinyl group, epoxy group, styryl group, methacryl group, or acryl group can be used. Furthermore, as another surface treatment method for the thermally conductive filler, organic fatty acid treatment or silica coating can be used.

The thermally conductive filler has an average particle size of 10 to 100 μm. By using a thermally conductive filler having an average particle size in the range of 10 to 100 μm, efficient heat transfer paths can be formed in the thermally conductive composition. In the case where particles of the thermally conductive filler having a small average particle size of less than 10 μm are incorporated, since the specific surface area of these particles of the thermally conductive filler is large, the viscosity of the thermally conductive composition is increased, and there is a concern that the handling property may be reduced. On the other hand, in the case where particles of the thermally conductive filler having a large particle size with an average particle size of more than 100 μm are incorporated, the thermally conductive composition loses flexibility and becomes fragile, and there is a concern that the handling property may be deteriorated.

In addition, out of 100% by volume of the thermally conductive filler, 30% to 80% by volume has a particle size of 40 μm or more, and preferably, 55% to 70% by volume has a particle size of 40 μm or more. Since 30% to 80% of particles of the thermally conductive filler with a large particle size of 40 μm or more is incorporated, heat transfer paths can be formed by a small number of particles of the thermally conductive filler. As a result, efficiency is improved in increasing the thermal conductivity of the thermally conductive composition. On the other hand, when an attempt is made to form heat transfer paths using a composition including many particles with a particle size smaller than this, since the number of particles of the thermally conductive filler is increased, there is a concern that efficiency may be deteriorated in increasing the thermal conductivity of the thermally conductive composition.

When the content of particles of the thermally conductive filler with a particle size of 40 μm or more is 55% by volume or more, the effect of incorporation of particles of the thermally conductive filler with a large particle size of 40 μm or more is enhanced, and the thermally conductive composition can have a thermal conductivity of 5 W/m·K or more.

Furthermore, out of 100% by volume of the thermally conductive filler, preferably, 20% to 50% by volume has a particle size of less than 5 μm, and more preferably, 20% to 35% by volume has a particle size of less than 5 μm. Since 20% to 50% by volume of particles with a particle size of less than 5 μm is incorporated, particles of the thermally conductive filler with a large particle size and particles of the thermally conductive filler with a small particle size can be combined. Accordingly, since particles of the thermally conductive filler with a small particle size enter gaps created by contact between particles of the thermally conductive filler with a large particle size, more efficient heat transfer paths can be formed in the polymer matrix. Furthermore, when 20% to 35% by volume of particles of the thermally conductive filler with a particle size of less than 5 μm is incorporated, an increase in the viscosity of the thermally conductive composition before curing can be suppressed.

Furthermore, preferably, the total content of particles of the thermally conductive filler with a particle size of 40 μm or more and particles of the thermally conductive filler with a particle size of less than 5 μm is 90% by volume or more in the whole thermally conductive filler. Although the reason for the preference is not obvious, it is considered that, in view of forming heat transfer paths, since particles of the thermally conductive filler with a small particle size, which fill the gaps between particles of the thermally conductive filler with a large particle size, have a proper size, the filling ratio of the particles is likely to increase in the thermally conductive composition, and many heat transfer paths are likely to be formed.

In order to measure the particle size of the thermally conductive filler, a scanning electron microscope (SEM) can be used. Furthermore, regarding qualitative analysis and quantitative analysis of the thermally conductive filler, energy dispersive X-ray analysis (EDX), differential scanning calorimetry (DSC), and X-ray fluorescence analysis (XRF) can be used. However, the analysis device and analysis method are not limited thereto. The average particle size (D50) of the thermally conductive filler described above is a volume-average particle size in the particle size distribution measured by the laser diffraction method (JIS R1629).

Furthermore, the content of the thermally conductive filler is 70% to 90% by volume, preferably, 80% to 90% by volume, relative to 100% by volume of the thermally conductive composition. The reason for this is that, regarding the thermally conductive composition obtained by incorporating a thermally conductive filler at a high filling ratio, when formed into a cured body, in the case where 80% to 90% by volume of aluminum nitride is incorporated as the thermally conductive filler, a very high thermal conductivity of 8 W/m·K or more can be achieved; when formed into a cured body, in the case where 80% to 90% by volume of aluminum oxide is incorporated as the thermally conductive filler, a relatively high thermal conductivity of 5 W/m·K or more can be achieved; and when formed into a cured body, in the case where a mixture of aluminum nitride and aluminum oxide is used as the thermally conductive filler, a high thermal conductivity of 6 W/m·K or more can be achieved. Furthermore, when aluminum nitride is added as the thermally conductive filler and the content of the thermally conductive filler exceeds 70% by volume, a thermal conductivity equivalent to 5 W/m·K can be achieved. When the content of the thermally conductive filler is less than 70% by volume, there is a concern that a desired thermal conductivity of at least 4.5 W/m·K may not be obtained. On the other hand, when the content of the thermally conductive filler exceeds 90% by volume, the amount of the thermally conductive filler becomes excessive, resulting in no room for incorporating a binder, an oil, and an oligomer, and there is a concern that a thermally conductive composition cannot be produced.

Methyl phenyl silicone: The methyl phenyl silicone is a non-reactive silicone having a structural formula in which methyl groups are partially replaced by phenyl groups as side chains to silicon atoms in the polysiloxane bond. The methyl phenyl silicone is a substance that imparts flexibility to a thermally conductive composition (e.g., a heat dissipation grease), and can improve the flexibility and bendability of a molded body obtained by curing the thermally conductive composition (e.g., a heat dissipation sheet). This property is noticeable even when the thermally conductive filler is incorporated at a high filling ratio. The methyl phenyl silicone can be added in the form of oil or in the form of oligomer. However, from the viewpoint that flexibility can be imparted to the thermally conductive composition and that flexibility and bendability can be imparted to a molded body obtained by curing the thermally conductive composition, addition in the form of oil is preferable. Furthermore, the methyl phenyl silicone has a kinematic viscosity, at 25° C., preferably in the range of 10 to 100,000 cSt, and more preferably in the range of 100 to 1,000 cSt from the viewpoint of dispersibility in the polymer matrix. Note that the kinematic viscosity is measured in accordance with JIS Z 8803:2011.

As the methyl phenyl silicone, it is preferable to use a methyl phenyl silicone oil with a refractive index (measured in accordance with JIS K 0062:1992) of 1.427 or more. A methyl phenyl silicone oil with a low refractive index is generally considered to have a low content of phenyl groups compared with a methyl phenyl silicone oil with a high refractive index. In order to impart flexibility to a heat dissipation grease and to impart flexibility and bendability to a heat dissipation sheet, which is a cured body thereof, a high content of phenyl groups is effective. Therefore, when a methyl phenyl silicone oil with a low refractive index is used, in order to impart flexibility to a heat dissipation grease and to impart flexibility and bendability to a heat dissipation sheet, it is necessary to add a larger amount of the methyl phenyl silicone oil, compared with a methyl phenyl silicone oil with a high refractive index. As a result, the volume content of the thermally conductive filler in the heat dissipation grease or heat dissipation sheet is decreased, and the thermal conductivity of the heat dissipation grease or heat dissipation sheet is deteriorated.

In contrast, by using a methyl phenyl silicone oil with a refractive index of 1.427 or more, without excessively increasing the amount of the methyl phenyl silicone oil added, flexibility can be imparted to the heat dissipation grease, and flexibility and bendability can be imparted to the heat dissipation sheet. Accordingly, there is little concern about oil bleeding, and furthermore, the filling amount of the thermally conductive filler can be increased by an amount by which the content of the methyl phenyl silicone oil is decreased. Therefore, it becomes possible to provide a thermally conductive composition having a much higher thermal conductivity and a thermally conductive molded body which is a cured body thereof.

The refractive index of the methyl phenyl silicone oil can be measured, for example, by the method in accordance with JIS K 0062:1992 after isolating bleeding oil by applying pressure with a roller or the like to the thermally conductive composition or a molded body which is a cured body thereof.

The content of the methyl phenyl silicone is preferably 1% to 10% by volume, and more preferably 2.3% to 8.2% by volume, relative to 100% by volume of the thermally conductive composition. The reason for this is that when the content of the methyl phenyl silicone is less than 1% by volume, it is not possible to impart sufficient flexibility to the thermally conductive composition, and furthermore, it is not possible to impart flexibility and bendability to a thermally conductive molded body which is a cured body thereof. On the other hand, when the content of the methyl phenyl silicone exceeds 10% by volume, there is a concern that oil may bleed from the thermally conductive composition or a thermally conductive molded body which is a cured body thereof.

Additives: As components other than those described above, various additives may be incorporated. Examples thereof include a plasticizer, a dispersing agent, a coupling agent, an adhesive, and the like, and organic components may be incorporated. Besides, a flame retardant, an antioxidant, a coloring agent, a reaction catalyst, and the like may be incorporated. However, these additives can be used within ranges that do not impair the function suitable for use of each of thermally conductive compositions used in the form of putty, grease, or sheet.

The thermally conductive composition can be produced by mixing the above-described components other than the thermally conductive filler, and further dispersing the thermally conductive filler in the polymer matrix.

<Thermally Conductive Molded Body>

A thermally conductive molded body is obtained by reaction curing of the thermally conductive composition described above. The type of reaction varies depending on the type of the polymer matrix contained, and may be heat curing or photo-curing. In the case where an addition-reactive silicone is used as the polymer matrix, preferably, the main agent and the curing agent thereof are mixed, and heat curing is performed.

Although being a cured body, the thermally conductive molded body has a relatively soft property, and the E hardness (in accordance with JIS K 6253-3:2012) thereof can be set to be 20 to 70, and preferably set to be 30 to 55. When the E hardness of the thermally conductive molded body is less than 20, there is a concern that the handling property may be deteriorated because of excessive softness. When the E hardness of the thermally conductive molded body is more than 70, there is a concern that adhesion to a heat-generating member and a cooling member may be deteriorated because of excessive hardness. When the E hardness is set to be 30 to 55, handling is facilitated, and excellent adhesion to a heat-generating member and a cooling member can be achieved.

The thermal conductivity of the thermally conductive molded body can be set to be 4.5 W/m·K or more, preferably 6 W/m·K or more, and more preferably 8 W/m·K or more. Since the thermally conductive molded body has a thermal conductivity of at least 4.5 W/m·K or more, excellent thermal conductivity can be achieved, and heat from a heat-generating member can be dissipated rapidly.

Examples

The present invention will be described on the basis of examples. Samples 1 to 8 described below were produced, and various tests were carried out.

<Production of Samples>

By mixing the components shown in Tables 1 and 2 below at the mixing ratios shown in Tables 1 and 2, thermally conductive compositions serving as Samples 1 to 8 were produced. Furthermore, by heating the thermally conductive compositions of Samples 1 to 8, the components contained in the samples were reacted and cured, and the compositions were each formed into a sheet shape. Thus, thermally conductive molded bodies serving as Samples 1 to 8, which were cured bodies of the thermally conductive compositions, were produced. The mixing ratios of the components in Tables 1 and 2 are indicated by % by volume.

TABLE 1

| | | | Sample 1 | Sample 2 | Sample 3 | Sample 4 |
|---|---|---|---|---|---|---|
| Thermally conductive composition (vol %) | | Addition-reaction-curable silicone (specific gravity 1) | 12.9 | 12.9 | 12.9 | 15.7 |
| | | Dimethyl silicone oil (refractive index 1.396) (specific gravity 1) | — | — | — | — |
| | | Methyl phenyl silicone oil A (refractive index 1.427) (specific gravity 1) | 5.6 | — | — | — |
| | | Methyl phenyl silicone oligomer (refractive index 1.460 (specific gravity 1) | — | 5.6 | — | — |
| | | Methyl phenyl silicone oil B (refractive index 1.496) (specific gravity 1) | — | — | 5.6 | 2.4 |
| | | Aluminum oxide (average particle size: 3 μm) (specific gravity 3.9) | 29.1 | 29.1 | 29.1 | 29.9 |
| | | Aluminum oxide (average particle size: 70 μm) (specific gravity 3.9) | — | — | — | 52.0 |
| | | Aluminum nitride (average particle size: 80 μm) (specific gravity 3.3) | 52.4 | 52.4 | 52.4 | — |
| Properties | Thermally conductive composition | Appearance of vehicle | White turbid | White turbid | White turbid | White turbid |
| | Thermally conductive molded body | Handleability | B | B | A | A |
| | | Cracking resistance | B | B | A | A |
| | | Thermal conductivity (W/m · K) | 8.5 | 8.4 | 8.5 | 5.3 |
| | | E hardness | 49 | 48 | 51 | 30 |
| | Thermally conductive filler | Content of thermally conductive filler (%) | 81.5 | 81.5 | 81.5 | 82.0 |
| | | Volume ratio of particles with a particle size of less than 5 μm in thermally conductive filler | 33.9 | 33.9 | 33.9 | 34.7 |
| | | Volume ratio of particles with a particle size of 40 μm or more in thermally conductive filler | 57.2 | 57.2 | 57.2 | 57.1 |

TABLE 2

|  |  | Sample 5 | Sample 6 | Sample 7 | Sample 8 |
|---|---|---|---|---|---|
| Thermally conductive composition (vol %) | Addition-reaction-curable silicone (specific gravity 1) | 12.8 | 10.2 | 18.7 | 12.9 |
|  | Dimethyl silicone oil (refractive index 1.396) (specific gravity 1) | — | — | — | 5.6 |
|  | Methyl phenyl silicone oil A (refractive index 1.427) (specific gravity 1) | — | — | — | — |
|  | Methyl phenyl silicone oligomer (refractive index 1.460) (specific gravity 1) | — | — | — | — |
|  | Methyl phenyl silicone oil B (refractive index 1.496) (specific gravity 1) | 1.8 | 4.4 | 8.2 | — |
|  | Aluminum oxide (average particle size: 3 μm) (specific gravity 3.9) | 24.2 | 24.0 | 34.3 | 29.1 |
|  | Aluminum oxide (average particle size: 70 μm) (specific gravity 3.9) | 61.2 | — | — | — |
|  | Aluminum nitride (average particle size: 80 μm) (specific gravity 3.3) | — | 61.4 | 38.8 | 52.4 |
| Properties | Thermally conductive composition — Appearance of vehicle | White turbid | White turbid | White turbid | Translucent |
|  | Thermally conductive molded body — Handleability | B | B | A | C |
|  | Cracking resistance | B | B | A | C |
|  | Thermal conductivity (W/m · K) | 5.7 | 9.0 | 4.9 | 6.1 |
|  | E hardness | 55 | 55 | 25 | Unmeasurable |
| Thermally conductive filler | Content of thermally conductive filler (%) | 85.4 | 85.4 | 73.1 | 81.5 |
|  | Volume ratio of particles with a particle size of less than 5 μm in thermally conductive filler | 26.9 | 26.7 | 44.6 | 33.9 |
|  | Volume ratio of particles with a particle size of 40 μm or more in thermally conductive filler | 64.5 | 64.7 | 47.8 | 57.2 |

In Tables 1 and 2, as the "methyl phenyl silicone oil", a methyl phenyl silicone oil with a refractive index of 1.427 or more was used. Furthermore, "Content of thermally conductive filler (%)" shown under the column titled "Thermally conductive filler" indicates the content (% by volume) of the thermally conductive filler relative to 100% by volume of the thermally conductive composition, and "Volume ratio of particles with a particle size of less than 5 μm in thermally conductive filler" and "Volume ratio of particles with a particle size of 40 μm or more in thermally conductive filler" each indicate a volume ratio (% by volume) of particles of the thermally conductive filler within a specific particle size range in the whole thermally conductive filler based on the particle distribution data of the thermally conductive filler.

<Properties of Sample>

Appearance of vehicle: The "vehicle" refers to a mixture of only liquid components before mixing the thermally conductive filler in preparing the thermally conductive composition. The mixed state thereof is observed and shown under the column titled "Appearance of vehicle" in Tables 1 and 2. Here, the state in which the oligomer and the oil incorporated in the addition-reactive silicone were mixed was observed to be "translucent", and the state in which the oligomer and the oil incorporated in the addition-reactive silicone were not mixed was observed to be "white turbid".

Handleability: When a thermally conductive molded body was produced from each of the thermally conductive compositions of Samples 1 to 8, a thermally conductive molded body of each of Samples 1 to 8 for testing handleability was obtained in the following manner. That is, the thermally conductive composition was applied onto a PET film and cured to obtain a thermally conductive molded body with a thickness of 1 mm, which was cut into a size of 20 mm in length and 20 mm in width, and a thermally conductive molded body (20 mm in length×20 mm in width×1 mm in thickness) of each of Samples 1 to 8 was obtained. When the thermally conductive molded body was peeled off from the PET film, the peeling state was observed, and handleability (handling property) was evaluated. The case where the thermally conductive molded body could not be peeled off from the PET film was evaluated as "C", the case where the thermally conductive molded body could be peeled off from the PET film was evaluated as "B", and the case where the thermally conductive molded body could be easily peeled off from the PET film without resistance was evaluated as "A".

Cracking resistance: A thermally conductive molded body of each of Samples 1 to 8 for testing cracking resistance was formed in the shape of a sheet of 20 mm in length×20 mm in width×1 mm in thickness. Both ends of the thermally conductive molded body were pinched between index finger and thumb and bent from 0° to 180° such that the two pinched ends overlapped with each other. When this bending (counted as one time) was repeated, the state of occurrence of cracking in the thermally conductive molded body depending on the number of bendings was observed and evaluated as cracking resistance. The case where cracking occurred when bending was performed one to two times was evaluated as "C", the case where cracking occurred when bending was performed three to five times was evaluated as "B", and the case where cracking occurred when bending was performed six or more times was evaluated as "A".

Thermal conductivity: The thermal conductivity was measured in accordance with the ASTM D5470 standard, and the measured values (W/m·K) are shown in Tables 1 and 2.

E hardness: The E hardness was measured in accordance with JIS K 6253-3:2012, and the measured values are shown in Tables 1 and 2. Here, the thermally conductive molded body of Sample 8 was hardened, and its hardness exceeded the measurement range of E hardness. Therefore, the E hardness thereof was described as "unmeasurable".

Among Samples 1 to 8, in Sample 8 containing no methyl phenyl silicone, the results of handleability and cracking resistance were no good, and the thermally conductive molded body was so hard that the E hardness could not be measured. On the other hand, among Samples 1 to 7 containing methyl phenyl silicone, in Sample 7, the content of the thermally conductive filler is 73.1%, and in any of other Samples 1 to 6, the content of the thermally conductive filler is as high as more than 80% by volume. In spite of this, the thermally conductive molded body has excellent handleability and cracking resistance and is soft with an E hardness of 55 at the highest. Furthermore, regarding the thermal conductivity of these thermally conductive molded bodies, in Samples 1 to 3 and Sample 6 filled with aluminum nitride, the thermal conductivity is 8.4 W/m·K or more, and in Samples 4 and 5 filled with aluminum oxide, the thermal conductivity is 5.3 W/m·K or more, thus showing that all of the samples have high thermal conductivity. Furthermore, even in Sample 7, the thermal conductivity is 4.9 W/m·K.

The invention claimed is:

1. A thermally conductive molded body formed of a cured body of a thermally conductive composition comprising:
   an addition-reaction-curable polymer matrix;
   a thermally conductive filler contained in the addition-reaction-curable polymer matrix, and
   a non-reactive methyl phenyl silicone oligomer contained in the addition-reaction-curable polymer matrix,
   wherein the thermally conductive filler has an average particle size of 10 to 100 μm, the content of the thermally conductive filler in the thermally conductive composition is 70% to 90% by volume, and 30% to 80% by volume of the thermally conductive filler has a particle size of 40 μm or more,
   wherein the content of the methyl phenyl silicone in the thermally conductive composition is 1% to 10% by volume,
   wherein the thermally conductive filler is at least one selected from aluminum oxide and aluminum nitride, and does not contain magnesium oxide, and
   wherein the thermally conductive molded body has a thermal conductivity of 4.5 W/m·K or more.

2. The thermally conductive composition according to claim 1, wherein the methyl phenyl silicone has a refractive index, in accordance with JIS K 0062:1992, of 1.427 or more.

3. The thermally conductive composition according to claim 1, wherein 20% to 50% by volume of the thermally conductive filler has a particle size of less than 5 μm.

4. The thermally conductive composition according to claim 1 wherein the total content of particles of the thermally conductive filler with a particle size of 40 μm or more and particles of the thermally conductive filler with a particle size of less than 5 μm is 90% by volume or more in the whole thermally conductive filler.

5. The thermally conductive composition according to claim 1, wherein the polymer matrix is an addition-reaction-curable silicone.

6. The thermally conductive molded body according to claim 1, wherein the thermally conductive molded body is sheet-shaped.

7. The thermally conductive molded body according to claim 1, wherein the thermally conductive molded body has an E hardness of 20 to 70.

8. The thermally conductive molded body according to claim 1, wherein the addition-reactive curable polymer matrix and the methyl phenyl silicone oligomer in preparing the thermally conductive composition before mixing the thermally conductive filler are observed to be white turbid.

9. The thermally conductive molded body according to claim 1, wherein the content of the methyl phenyl silicone is 2.3% to 8.2% by volume relative to 100% by volume of the thermally conductive composition.

10. A thermally conductive molded body formed of a cured body of a thermally conductive composition comprising:
    an addition-reaction-curable polymer matrix;
    a thermally conductive filler contained in the addition-reaction-curable polymer matrix, and
    a non-reactive methyl phenyl silicone oil contained in the addition-reaction-curable polymer matrix,
    wherein the thermally conductive filler has an average particle size of 10 to 100 μm, the content of the thermally conductive filler in the thermally conductive composition is 70% to 90% by volume, and 30% to 80% by volume of the thermally conductive filler has a particle size of 40 μm or more,
    wherein the content of the methyl phenyl silicone in the thermally conductive composition is 1% to 10% by volume,
    wherein the thermally conductive filler is at least one selected from aluminum oxide and aluminum nitride, and does not contain magnesium oxide, and
    wherein the thermally conductive molded body has a thermal conductivity of 4.5 W/m·K or more.

11. The thermally conductive composition according to claim 1 wherein the total content of particles of the thermally conductive filler with a particle size of 70 μm or more and particles of the thermally conductive filler with a particle size of less than 5 μm is 90% by volume or more in the whole thermally conductive filler.

12. The thermally conductive molded body according to claim 10, wherein the addition-reactive curable polymer matrix and the non-reactive methyl phenyl silicone oil in preparing the thermally conductive composition before mixing the thermally conductive filler are observed to be white turbid.

* * * * *